(12) United States Patent
Tahara et al.

(10) Patent No.: US 10,825,688 B2
(45) Date of Patent: Nov. 3, 2020

(54) METHOD FOR ETCHING COPPER LAYER

(71) Applicant: TOKYO ELECTRON LIMITED, Tokyo (JP)

(72) Inventors: Shigeru Tahara, Miyagi (JP); Daisuke Urayama, Miyagi (JP); Kenji Matsumoto, Miyagi (JP); Hidenori Miyoshi, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/308,428

(22) PCT Filed: Jun. 7, 2017

(86) PCT No.: PCT/JP2017/021196
§ 371 (c)(1),
(2) Date: Dec. 7, 2018

(87) PCT Pub. No.: WO2017/213193
PCT Pub. Date: Dec. 14, 2017

(65) Prior Publication Data
US 2019/0272997 A1 Sep. 5, 2019

(30) Foreign Application Priority Data

Jun. 10, 2016 (JP) .................................. 2016-116298
Nov. 9, 2016 (JP) .................................. 2016-218975

(51) Int. Cl.
*H01L 21/3065* (2006.01)
*C23F 4/00* (2006.01)
(Continued)

(52) U.S. Cl.
CPC ............ *H01L 21/3065* (2013.01); *C23F 4/00* (2013.01); *H01L 21/32136* (2013.01); *H01L 23/532* (2013.01); *H05H 1/46* (2013.01)

(58) Field of Classification Search
None
See application file for complete search history.

(56) References Cited

U.S. PATENT DOCUMENTS 6,323,121 B1 * 11/2001 Liu .................. H01L 21/02063
257/E21.226
7,758,739 B2 * 7/2010 Gorrell ............. H01L 21/32136
204/229.4
(Continued)

FOREIGN PATENT DOCUMENTS

JP 2011-094100 A 5/2011
JP 2013-120810 A 6/2013

OTHER PUBLICATIONS

International Search Report issued in PCT/JP2017/021196; dated Sep. 5, 2017.
(Continued)

Primary Examiner — Allan W. Olsen
(74) Attorney, Agent, or Firm — Studebaker & Brackett PC

(57) ABSTRACT

A method MT in an embodiment is a method for etching an etching target layer EL which is included in a wafer W and contains copper. The wafer W includes the etching target layer EL, and a mask MK provided on the etching target layer EL. In the method MT, the etching target layer EL is etched by repeatedly executing a sequence SQ including a first step of generating a plasma of a first gas in a processing container 12 of a plasma processing apparatus 10 in which the wafer W is accommodated, a second step of generating a plasma of a second gas in the processing container 12, and a third step of generating a plasma of a third gas in the processing container 12. The first gas contains a hydrocarbon gas, the second gas contains either a rare gas or a mixed gas of a rare gas and hydrogen gas, and the third gas contains hydrogen gas.

16 Claims, 10 Drawing Sheets

(a)

| TAPER ANGLE [°] | | SPUTTERING AMOUNT OF HYDROCARBON FILM | | |
|---|---|---|---|---|
| | | 3.0 [nm] | 4.5 [nm] | 6.0 [nm] |
| FILM THICKNESS OF HYDROCARBON FILM | 1.5 [nm] | 84.38 | 82.36 | 78.03 |
| | 1.3 [nm] | 83.45 | 79.80 | 77.70 |
| | 1.1 [nm] | 81.99 | 78.68 | 76.34 |

(b)

| RATIO SPUTTERING AMOUNT OF HYDROCARBON FILM [nm] / FILM THICKNESS OF HYDROCARBON FILM [nm] | | SPUTTERING AMOUNT OF HYDROCARBON FILM | | |
|---|---|---|---|---|
| | | 3.0 [nm] | 4.5 [nm] | 6.0 [nm] |
| FILM THICKNESS OF HYDROCARBON FILM | 1.5 [nm] | 2.0 | 3.0 | 4.0 |
| | 1.3 [nm] | 2.3 | 3.5 | 4.6 |
| | 1.1 [nm] | 2.7 | 4.1 | 5.5 |

(51) Int. Cl.
*H01L 21/3213* (2006.01)
*H01L 23/532* (2006.01)
*H05H 1/46* (2006.01)

(56) References Cited

U.S. PATENT DOCUMENTS

| | | | |
|---|---|---|---|
| 2006/0035173 A1* | 2/2006 | Davidson | H01L 21/32136 430/318 |
| 2011/0303643 A1* | 12/2011 | Wada | H01J 37/32091 216/71 |
| 2012/0164839 A1* | 6/2012 | Nishimura | C23F 4/00 438/720 |
| 2015/0325522 A1* | 11/2015 | Yeh | H01L 21/2855 257/741 |
| 2016/0097131 A1 | 4/2016 | Agarwal et al. | |
| 2017/0053863 A1* | 2/2017 | Lu | H01L 21/76883 |

OTHER PUBLICATIONS

Fangyu Wo et al., "Low-Temperature Etching of Cu by Hydrogen-Based Plasmas", ACS Applied Materials & Interfaces, Jul. 2010, vol. 2, No. 8, pp. 2175-2179.

* cited by examiner

| FILM THICKNESS OF HYDROCARBON FILM | TAPER ANGLE [°] SPUTTERING AMOUNT OF HYDROCARBON FILM | | |
|---|---|---|---|
| | 3.0 [nm] | 4.5 [nm] | 6.0 [nm] |
| 1.5 [nm] | 84.38 | 82.36 | 78.03 |
| 1.3 [nm] | 83.45 | 79.80 | 77.70 |
| 1.1 [nm] | 81.99 | 78.68 | 76.34 |

(b)

| FILM THICKNESS OF HYDROCARBON FILM | RATIO: SPUTTERING AMOUNT OF HYDROCARBON FILM [nm] / FILM THICKNESS OF HYDROCARBON FILM [nm] | | |
|---|---|---|---|
| | 3.0 [nm] | 4.5 [nm] | 6.0 [nm] |
| 1.5 [nm] | 2.0 | 3.0 | 4.0 |
| 1.3 [nm] | 2.3 | 3.5 | 4.6 |
| 1.1 [nm] | 2.7 | 4.1 | 5.5 |

METHOD FOR ETCHING COPPER LAYER

TECHNICAL FIELD

Embodiments of the present invention relate to a method for etching a copper layer.

BACKGROUND ART

In the manufacturing of a semiconductor device, a process of forming wires such as interconnect lines and contacts is performed. As this process, for example, a process called a Damascene process has been hitherto used. In the Damascene process, a process of forming a shape such as a groove or a hole in an interlayer insulating film by etching and burying a metal material in the formed groove or hole is performed. However, with miniaturization of wires in recent years, various problems such as a problem that it is difficult to bury a metal material in fine holes or grooves in the Damascene process have been incurred. In order to cope with the problems in the Damascene process, a process of forming a copper layer and thereafter forming a fine copper wire by etching the copper layer has been proposed. Such a process is disclosed in Non-Patent Literature 1. In the process disclosed in Non-Patent Literature 1, the copper layer is etched by exposing the copper layer to a plasma of a processing gas containing hydrogen gas and argon gas.

CITATION LIST

Non Patent Literature

[Non-Patent Literature 1] Fangyu Wu et al., "Low-Temperature Etching of Cu by Hydrogen-Based Plasmas", ACS APPLIED MATERIALS & INTERFACES, 2010, Vol. 2, No. 8, p. 2175 to 2179

SUMMARY OF INVENTION

Technical Problem

However, it is difficult to secure the verticality of a side surface of a copper wire during etching by a plasma of a processing gas containing hydrogen gas and argon gas. Therefore, in the technical field, it is necessary to improve the verticality of a pattern side surface formed by etching a copper layer of a workpiece.

Solution to Problem

In an aspect, a method for etching a copper layer of a workpiece is provided. The workpiece includes the copper layer and a mask provided on the copper layer. The method includes etching the copper layer by repeatedly executing a sequence including a first step of generating a plasma of a first gas in a processing container of a plasma processing apparatus in which the workpiece is accommodated, a second step of generating a plasma of a second gas in the processing container after the first step, and a third step of generating a plasma of a third gas in the processing container after the second step, in which the first gas contains a hydrocarbon gas, the second gas contains either a rare gas or a mixed gas of a rare gas and hydrogen gas, and the third gas contains hydrogen gas.

According to the aspect, whenever the sequence is executed, in the first step, in the first step, the film containing carbon is formed on the copper layer, in the second step subsequent to the first step, the film containing carbon is sputtered and is thus removed, carbon contained in the film diffuses into the copper layer, and a mixed layer of copper and carbon is formed on the surface of the copper layer and is simultaneously removed, and in the third step subsequent to the second step, excess carbon is removed from the mixed layer and a side surface (which includes a side surface of the mask and after etching, includes the side surface of a trench of the copper layer formed by the etching) of a groove (which is a groove defined by the mask and after etching, includes the trench of the copper layer formed by the etching) of a pattern defined by the mask. Accordingly, in the case where the sequence is repeatedly executed, etching of the copper layer can be performed without stopping etching due to excess carbon. In addition, since the amount of excess carbon of the side surface of the groove of the pattern decreases, the verticality of the side surface of the groove of the pattern is improved.

In an embodiment, an amount of copper of the copper layer etched by the plasma of the second gas in the second step is larger than any of an amount of copper of the copper layer etched by the plasma of the first gas in the first step and an amount of copper of the copper layer etched by the plasma of the third gas in the third step. Removal of the copper layer, which is mainly performed in the second step, leads to chemically assisted etching of the copper layer, and thus leads to prevention of a processed shape of the copper layer from becoming a tapered shape due to removal of the copper layer which is mainly performed by physical sputtering.

In the embodiment, a film thickness of a film formed on the mask and the copper layer by the plasma of the first gas in the first step is 0.8 [nm] or more and 1.2 [nm] or less. According to the embodiment, since the film thickness of the film formed on the mask and the copper layer by the plasma of the first gas in the first step is 0.8 [nm] or more and 1.2 [nm] or less, etching by sputtering performed in the second step is realized with high selectivity, so that the verticality of the side surface of the groove of the pattern defined by the mask is improved. Therefore, the verticality during processing of the copper layer can be improved.

In the embodiment, an execution time of the first step is increased or decreased according to an aspect ratio of a groove of a pattern defined by the mask during execution of the first step. According to the embodiment, the execution time of the first step can be increased or decreased according to the aspect ratio of the groove of the pattern which increases with the progress of etching. Therefore, since the execution time of the first step can be increased or decreased according to the aspect ratio, a uniform film can be formed on the copper layer and the surface of the mask by the plasma of the first gas regardless of the change in the aspect ratio of the groove of the pattern defined by the mask during the execution of the first step. The aspect ratio of the groove of the pattern is the ratio of the width of the groove to the height of the groove.

In the embodiment, an execution time of the second step is increased or decreased according to an aspect ratio of a groove of a pattern defined by the mask during execution of the second step. According to the embodiment, the execution time of the second step can be increased or decreased according to the aspect ratio of the groove of the pattern which increases with the progress of etching. Therefore, the execution time of the second step can be increased or decreased according to the change in the aspect ratio of the groove of the pattern defined by the mask during the execution of the second step with the progress of the etching.

Therefore, regardless of the aspect ratio of the groove of the pattern defined by the mask during the execution of the second step, etching of the film that is formed in the first step and contains carbon and furthermore, etching of the mixed layer that is formed in the second step and contains copper and carbon can be more suitably performed by the plasma of the second gas within the execution time of the second step.

In the embodiment, in the second step, a bias voltage applied to the workpiece in a case of generating the plasma of the second gas is in a range of 100 [V] to 400 [V]. According to the embodiment, in the second step, since the bias voltage applied to the workpiece in the case where the plasma of the second gas is generated is in a range of 100 [V] to 400 [V], in the second step, a sufficient ion energy to penetrate the film of hydrocarbon deposited in the first step is obtained, the mixed layer of the hydrocarbon film and the copper layer is formed, and furthermore, it becomes possible to remove the mixed layer by sputtering. The energy of ions accelerated by the bias voltage in this case corresponds to a range of 200 [eV] or less. Furthermore, since etching of the copper layer proceeds faster than etching of the mask, sputtering performed in the second step is realized with high selectivity, and the verticality of the side surface of the groove of the pattern defined by the mask is improved. As described above, the volatility of sputtered by-products increases due to the effect of mixing the organic layer and the copper layer, so that the verticality of the processing of the copper layer can be improved.

In the embodiment, an execution time of the second step is 2.0 times or more and 3.5 times or less a time necessary for etching the film and removing the film under a process condition of the second step excluding a condition of the execution time. According to the embodiment, the execution time of the second step is 2.0 times or more and 3.5 times or less the time necessary for etching the film of hydrocarbon deposited in the first step and removing the film. Therefore, the film of hydrocarbon deposited in the first step and the copper layer are mixed by the ion energy in the second step and it is possible to perform chemically assisted etching on the copper layer. Furthermore, the process can proceed to the third step, which is executed after the second step, before the film of hydrocarbon is completely removed and etching proceeds to pure sputtering of copper of the copper layer. As described above, since the second step is stopped before the mixed layer is completely removed in the second step, the verticality of the processing of the copper layer is increased, excess carbon is removed by the third step, which is executed after the second step, and thus deposition of carbon due to the progress of etching is suppressed. Therefore, etching of the copper layer is reliably performed.

In the embodiment, in the third step, a bias voltage applied to the workpiece in a case of generating the plasma of the third gas is in a range of higher than 100 [V] and lower than 600 [V]. According to the embodiment, in the third step, since the bias voltage applied to the workpiece in the case where the plasma of the third gas is generated is in a range of higher than 100 [V] and lower than 600 [V], the sputter yield to the copper layer in the third step is smaller than the sputter yield to the copper layer in the second step. Furthermore, according to the embodiment, in the third step, since the bias voltage applied to the workpiece in the case where the plasma of the third gas is generated is in a range of higher than 100 [V] and lower than 600 [V], the sputter yield to a layer containing carbon in the third step is larger than the sputter yield to the copper layer. Therefore, in the third step, removal of carbon from the film that is formed by the plasma of the first gas in the first step and contains carbon and from the mixed layer that is formed by the plasma of the second gas in the second step and contains carbon and copper can be selectively performed. This is because the sputtering rate of hydrogen with respect to copper is low and carbon is efficiently removed by the formation of a hydrocarbon gas. The energy of ions accelerated by the bias voltage in this case corresponds to a range of higher than 50 [eV] and lower than 300 [eV].

In the embodiment, the first gas contains $CH_4$ gas. According to the embodiment, since the first gas contains $CH_4$ gas, the film containing carbon can be formed on the mask and the copper layer in the first step.

In the embodiment, an electrode plate of an upper electrode of the plasma apparatus contains silicon carbide or copper, and the upper electrode is provided above a placing table which supports the workpiece in the processing container. According to the embodiment, since the electrode plate of the upper electrode contains silicon carbide or copper, in a case where copper is deposited on the electrode plate of the upper electrode by etching performed in the sequence, the change in the conductivity of the electrode plate due to the diffusion of copper atoms into the electrode plate can be reduced. Accordingly, the reproducibility of the etching process can be improved.

In the embodiment, a fourth step of applying a DC voltage or applying a high-frequency voltage between an upper electrode and a lower electrode of the plasma processing apparatus is further included, the upper electrode is provided above a placing table which supports the workpiece in the processing container, the lower electrode is provided in the placing table, and the fourth step is executed after the sequence is repeatedly executed so that an etching of the copper layer is ended, and the workpiece is unloaded. According to the embodiment, the fourth step is further included for cleaning the plasma processing apparatus. In the fourth step, a negative static voltage is applied, or a high-frequency voltage is applied to the upper electrode in the presence of the plasma. The fourth step is executed after the sequence including the first to third steps is repeatedly executed so that the etching of the copper layer is ended and the workpiece is unloaded from the plasma processing apparatus. That is, ions are drawn from the plasma to the upper electrode of the plasma processing apparatus such that deposition containing copper adhered to the upper electrode can be sputtered and removed.

In the embodiment, the workpiece further includes an underlayer, and the copper layer is provided on the underlayer. The method according to the embodiment may further include a fifth step of removing copper of the copper layer remaining on the underlayer after the copper layer is etched until the underlayer is reached by repeatedly executing the sequence and before the underlayer is etched. According to the embodiment, even in the case where copper remains in the underlayer after the copper layer is etched until the underlayer is reached, since copper is removed before performing etching on the underlayer, it is possible to prevent etching of the underlayer from being impeded by copper.

In the embodiment, a material of the underlayer is Ta, TaN, or Ru, and in the fifth step, copper remaining on the underlayer can be removed by wet cleaning using hydrofluoric acid or citric acid. According to the embodiment, in particular, in a case where the underlayer is Ta, TaN, or Ru, in the fifth step, it is possible to remove copper remaining on the underlayer by using wet cleaning using hydrofluoric acid or citric acid.

Advantageous Effects of Invention

As described above, according to the aspect, it is possible to improve the verticality of the side surface of the pattern formed by etching the copper layer of the workpiece.

BRIEF DESCRIPTION OF DRAWINGS

FIG. 8 includes parts (a) and (b), and parts. (a) and (b) are diagrams showing tables for describing the measurement result shown in FIG. 7, in which part (a) shows a taper angle of a side surface of a groove of a pattern in the copper layer after etching obtained in a case where the workpiece is etched under a condition corresponding to a value on the vertical axis and a value on the horizontal axis, and part. (b) shows the ratio of the value on the vertical axis to the value of the rotating shaft in FIG. 7.

DESCRIPTION OF EMBODIMENTS

Figure 1:
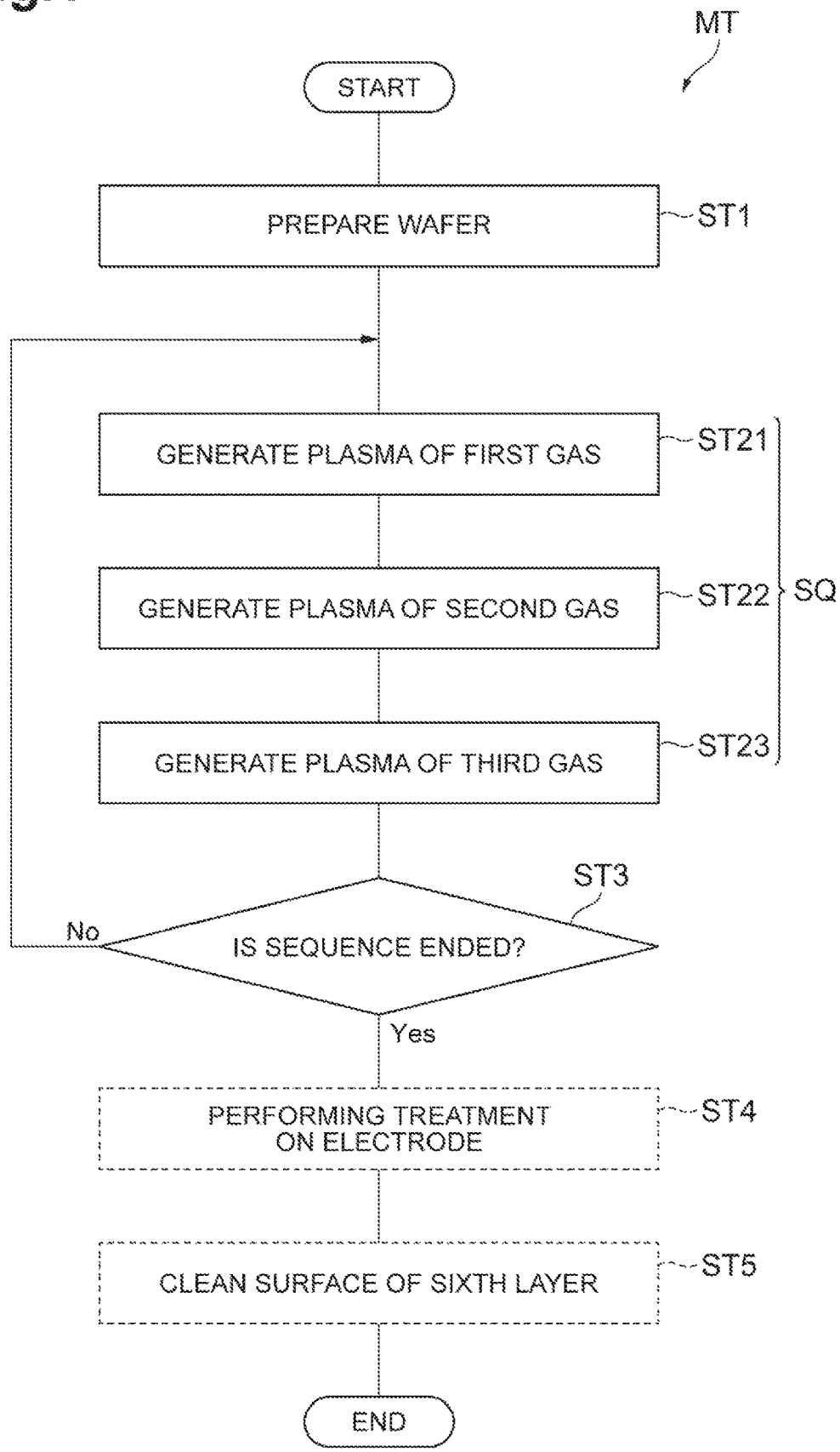
FIG. 1 is a flowchart showing a method according to an embodiment.
Figure 2:
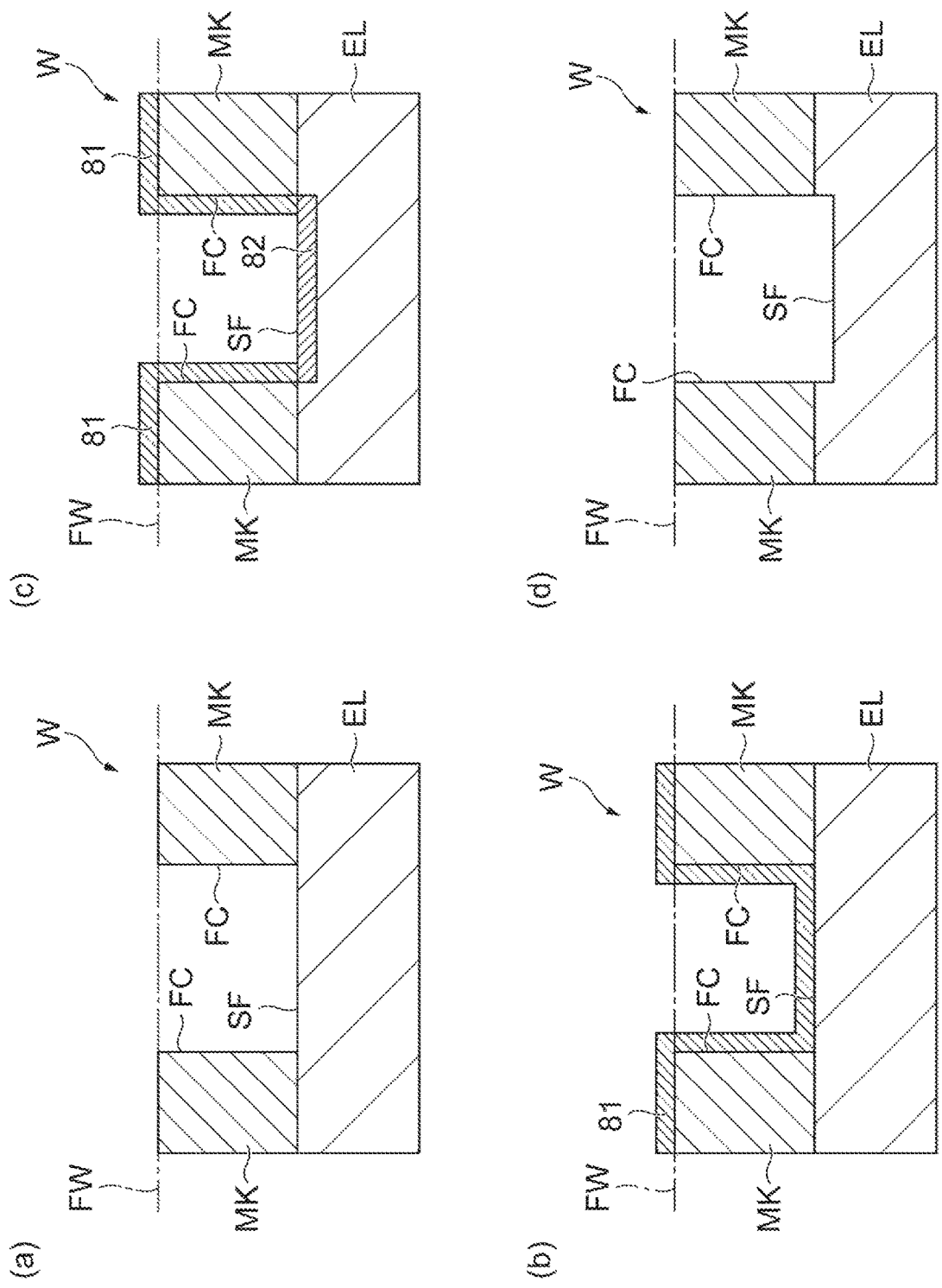
FIG. 2 includes parts (a), (b), (c), and (d), in which part (a) is a sectional view illustrating a main constituent portion of a workpiece before execution of each step of the method shown in FIG. 1. Parts. (b) to (d) are sectional views illustrating states of the main constituent portion of the workpiece after the execution of each step of the method MT shown in FIG. 1.
Figure 3:
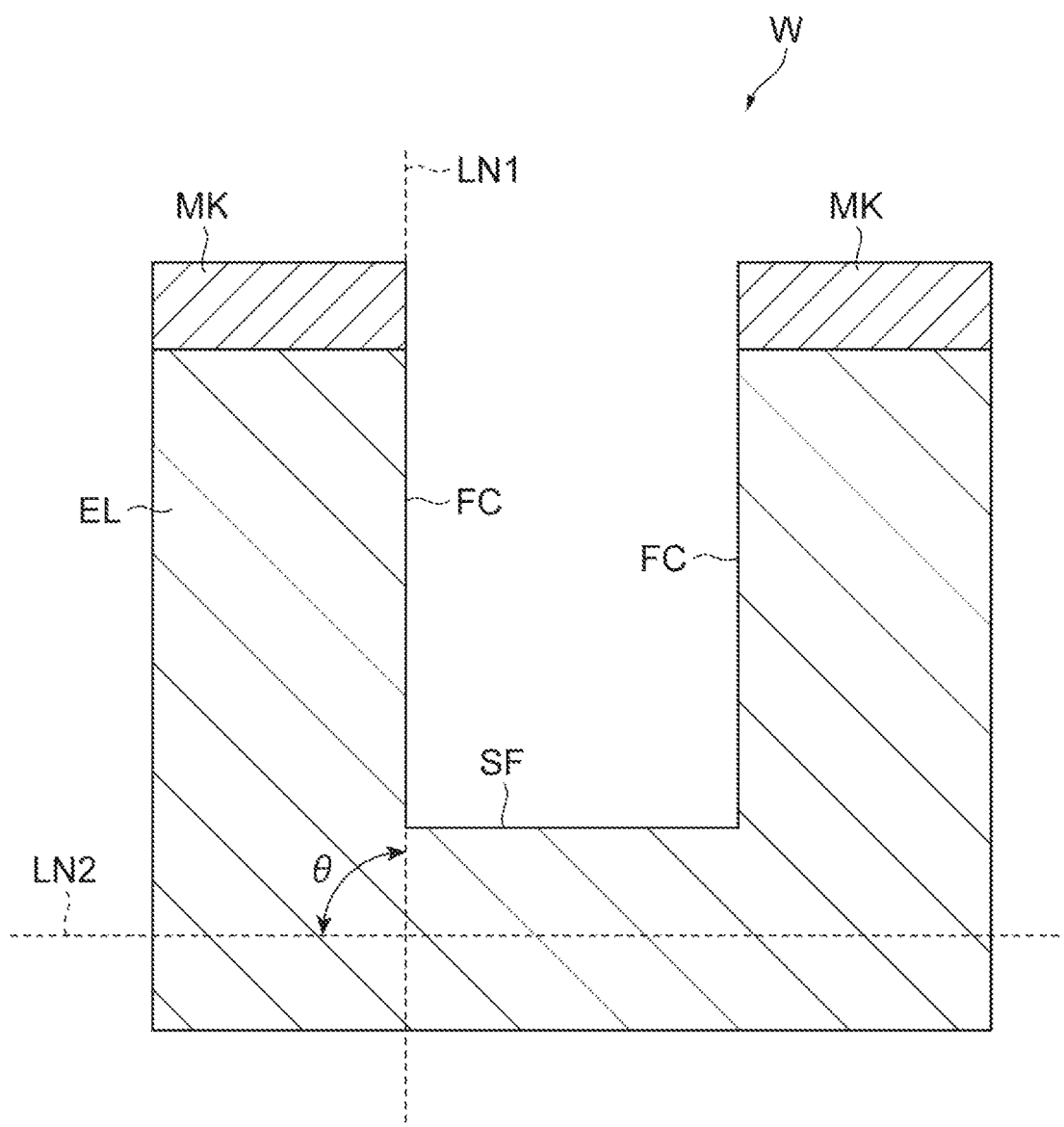
FIG. 3 is a sectional view illustrating a state of a main portion of the workpiece after multiple executions of a sequence included in the method shown in FIG. 1 a plurality of times.

Hereinafter, various embodiments will be described in detail with reference to the drawings. In the drawings, like elements which are the same or similar are denoted by like reference numerals. FIG. 1 is a flowchart showing a method according to an embodiment of etching a copper layer of a workpiece. The method MT illustrated in FIG. 1 is an embodiment of a method for etching a copper layer of a workpiece. The method MT illustrated in FIG. 1 includes a step ST1 and a sequence SQ shown in FIG. 1. Furthermore, there may be cases where the method MT includes a step ST4 shown in FIG. 1. Part (a) of FIG. 2 is a sectional view illustrating a main constituent portion of the workpiece (hereinafter, referred to as a wafer W) which is an object to which the method MT illustrated in FIG. 1 is applied. FIG. 3 is a sectional view illustrating a state of a main portion of the wafer W after multiple executions of the sequence SQ included in the method MT illustrated in FIG. 1.

First, referring to part (a) of FIG. 2, the configuration of the wafer W which is the object to which the method MT is applied. Part (a) of FIG. 2 is a sectional view illustrating the main constituent portion of the wafer W before execution of each step of the method MT shown in FIG. 1. The wafer W illustrated in part (a) of FIG. 2 is obtained by being subjected to a process such as etching before execution of the method MT. More specifically, for example, using a wafer in which a first layer (an etching target layer EL illustrated in part (a) of FIG. 2), a second layer, a third layer, a fourth layer, and a fifth layer are laminated in this order and a mask is provided on the fifth layer, the wafer W illustrated in part (a) of FIG. 2 is obtained performing a process such as etching sequentially on the second to fifth layers. The etching target layer EL is a copper layer. Specifically, the material of the second layer is, for example, TiW or the like, the material of the third layer is SiN or the like, the material of the fourth layer is, for example, an organic film or the like, the material of the fifth layer is, for example, SiON or the like, and the material of the mask is, for example, a photoresist or the like. Furthermore, the first layer is laminated on a sixth layer (an underlayer ML illustrated in FIG. 10) having a material such as Ta, TaN, Ru, or the like. As described above, the method MT is a portion of a series of processing steps performed on the wafer consisting of the first to sixth layers, and particularly corresponds to a step of etching the etching target layer EL which is the first layer (a step of etching the copper layer). The mask defines a pattern on the wafer, and the pattern is transferred onto the etching target layer EL by etching the wafer.

A mask MK is provided on a principal surface SF of the etching target layer EL illustrated in part (a) of FIG. 2. The mask MK is obtained by etching the second layer and the like. Therefore, the mask MK contains the same material as that of the second layer, for example, TiW or the like.

Figure 4:
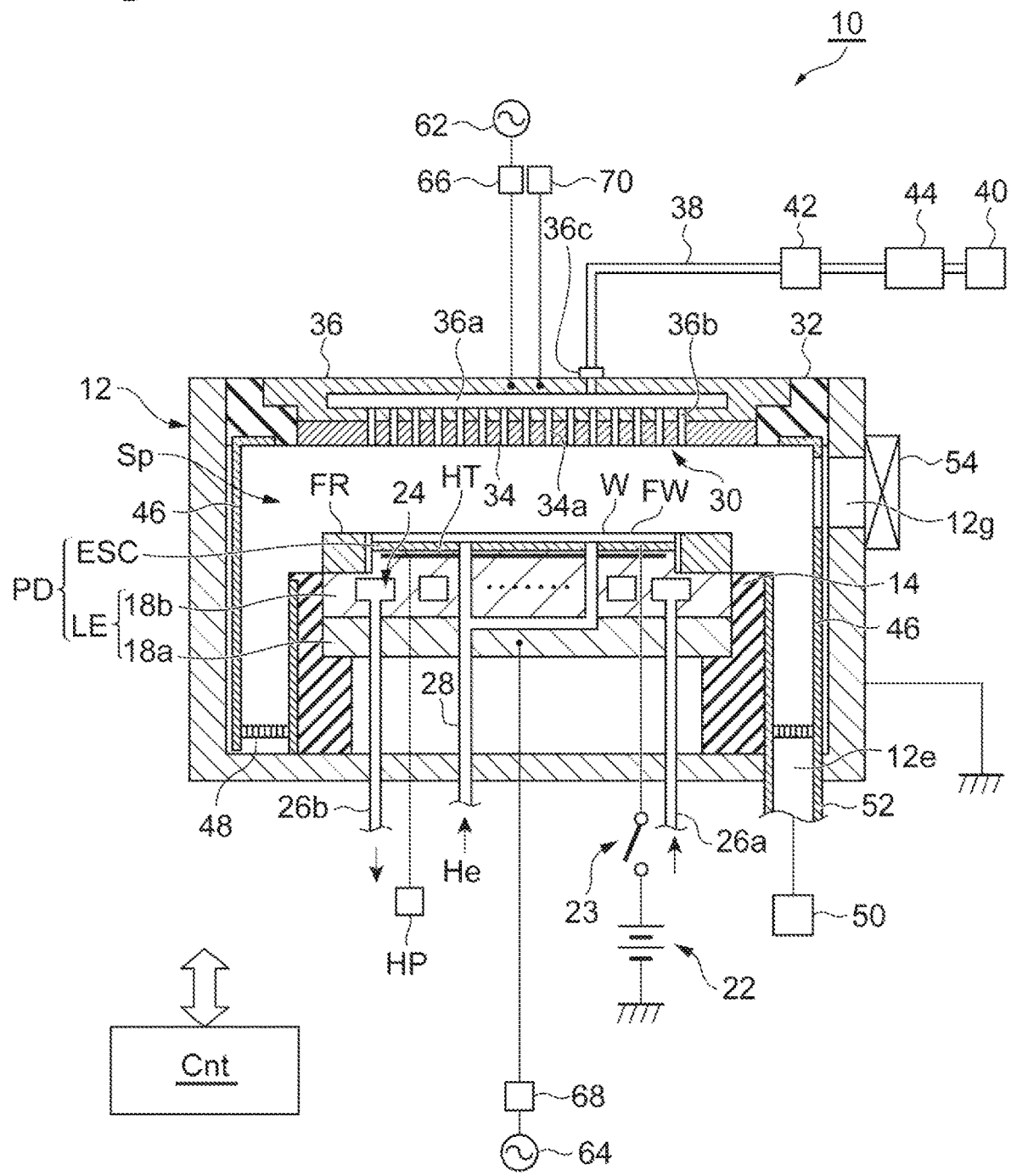
FIG. 4 is a view illustrating an example of a plasma processing apparatus which can be used for executing the method shown in FIG. 1.

Next, a configuration of a plasma processing apparatus which can be used for executing the method MT will be described. The method MT is executed by the plasma processing apparatus. FIG. 4 is a view illustrating an example of the plasma processing apparatus which can be used for executing the method MT shown in FIG. 1. FIG. 4 schematically illustrates a sectional structure of a plasma processing apparatus 10 which can be used in various embodiments of the method MT.

As illustrated in FIG. 4, the plasma processing apparatus 10 is a plasma etching apparatus including parallel flat plate electrodes, and includes a processing container 12. The processing container 12 has a substantially cylindrical shape and defines a processing space Sp. The processing container 12 is formed of, for example, aluminum and its inner wall surface is subjected to an anodizing process. The processing container 12 is grounded for safety.

A substantially cylindrical support portion 14 is provided on a bottom portion of the processing container 12. The support portion 14 is formed of, for example, an insulating material. The insulating material forming the support portion 14 may contain oxygen like quartz. The support portion 14 extends from the bottom portion of the processing container 12 in a vertical direction (upward from the bottom portion of the processing container 12) in the processing container 12. In the processing container 12, a placing table PD is provided. The placing table PD is supported by the support portion 14.

The placing table PD holds the wafer W on the upper surface of the placing table PD. The principal surface FW of the wafer W is on a side opposite to the back surface of the wafer W which is in contact with the upper surface of the placing table PD and faces an upper electrode 30. The placing table PD has a lower electrode LE and an electrostatic chuck ESC. The lower electrode LE includes a first plate 18a and a second plate 18b. The first plate 18a and the second plate 18b are formed of metal such as aluminum and have a substantially disk shape. The second plate 18b is provided on the first plate 18a and is electrically connected to the first plate 18a.

The electrostatic chuck ESC is provided on the second plate 18b. The electrostatic chuck ESC has a structure in which an electric which is a conductive film is interposed between a pair of insulating layers or a pair of insulating sheets. A DC power source 22 is electrically connected to the electrostatic chuck ESC via a switch 23. In a case where the wafer W is placed on the placing table PD, the wafer W is in contact with the electrostatic chuck ESC. The electrostatic chuck ESC causes the wafer W to be adsorbed thereto by an electrostatic force such as a Coulomb force generated by a DC voltage from the DC power source 22. Accordingly, the electrostatic chuck ESC can hold the wafer W.

A focus ring FR is disposed to surround the edge of the wafer W and the electrostatic chuck ESC on the peripheral portion of the second plate 18b. The focus ring FR is provided to improve etching uniformity. The focus ring FR is formed of a material appropriately selected depending on the material of the film to be etched, and can be formed of, for example, quartz. The material of the focus ring FR may contain silicon carbide and copper like an electrode plate 34 of the upper electrode 30.

A refrigerant flow path 24 is provided inside the second plate 18b. The refrigerant flow path 24 constitutes a temperature control mechanism. A refrigerant is supplied to the refrigerant flow path 24 from a chiller unit (not illustrated) provided outside the processing container 12 via a pipe 26a. The refrigerant supplied to the refrigerant flow path 24 is returned to the chiller unit via the pipe 26b. As described above, the refrigerant is supplied to the refrigerant flow path 24 so as to circulate. By controlling the temperature of the refrigerant, the temperature of the wafer W supported by the electrostatic chuck ESC can be controlled.

The plasma processing apparatus 10 is provided with a gas supply line 28. The gas supply line 28 supplies a heat transfer gas, for example, He gas from a heat transfer gas supply mechanism to a space between the upper surface of the electrostatic chuck ESC and the back surface of the wafer W.

In the plasma processing apparatus 10, a heater HT that controls the temperature of the wafer W is provided. The heater HT is embedded in the electrostatic chuck ESC, or embedded in the second plate 18b. A heater power source HP is connected to the heater HT. By supplying electric power from the heater power source HP to the heater HT, the temperature of the electrostatic chuck ESC is adjusted such that the temperature of the wafer W placed on the electrostatic chuck ESC is adjusted.

The plasma processing apparatus 10 includes the upper electrode 30. The upper electrode 30 is provided above the placing table PD in the processing container 12 so as to face the placing table PD. The lower electrode LE and the upper electrode 30 are provided substantially parallel to each other and constitute the parallel flat plate electrodes. The processing space Sp where plasma processing is performed on the wafer W is provided between the upper electrode 30 and the lower electrode LE.

The upper electrode 30 is supported by an upper portion of the processing container 12 via an insulating shielding member 32. The insulating shielding member 32 is formed of an insulating material. The upper electrode 30 may include the electrode plate 34 and an electrode support body 36. The electrode plate 34 faces the processing space Sp, and the electrode plate 34 is provided with a plurality of gas discharge holes 34a. In the embodiment, the electrode plate 34 may contain silicon carbide or copper.

The electrode support body 36 detachably supports the electrode plate 34, and can be formed of a conductive material such as aluminum. The electrode support body 36 may have a water cooling structure. A gas diffusion chamber 36a is provided inside the electrode support body 36. A plurality of gas flow holes 36b communicating with the gas discharge holes 34a extend downward (in a direction toward the placing table PD in the processing container 12) from the gas diffusion chamber 36a. A gas introduction port 36c through which the processing gas is introduced to the gas diffusion chamber 36a is formed in the electrode support body 36, and a gas supply pipe 38 is connected to the gas introduction port 36c.

A gas source group 40 is connected to the gas supply pipe 38 via a valve group 42 and a flow rate controller group 44. The gas source group 40 has a plurality of gas sources. The plurality of gas sources may include a source of a hydrocarbon-based gas ($C_xH_y$ gas (x and y are integers of 1 to 10)), a source of hydrogen gas, a source of a halogen-containing gas, a source of a rare gas, and the like.

The valve group 42 includes a plurality of valves, and the flow rate controller group 44 includes a plurality of flow rate controller such as a mass flow controller. Each of the plurality of gas sources of the gas source group 40 is connected to the gas supply pipe 38 via a corresponding valve of the valve group 42 and a corresponding flow rate controller of the flow rate controller group 44. Therefore, the plasma processing apparatus 10 can supply gases from one or more gas sources selected from among the plurality of gas sources of the gas source group 40 into the processing container 12 at individually adjusted flow rates.

In the plasma processing apparatus 10, a deposition shield 46 is detachably provided along the inner wall of the processing container 12. The deposition shield 46 is also provided on the outer periphery of the support portion 14. The deposition shield 46 prevents etching by-products (deposition) from adhering to the processing container 12.

An exhaust plate 48 is provided on the bottom side of the processing container 12 between the support portion 14 and the side wall of the processing container 12. An exhaust port 12e is provided below the exhaust plate 48 in the processing container 12. An exhaust device 50 is connected to the exhaust port 12e via an exhaust pipe 52. The exhaust device 50 has a vacuum pump such as a turbomolecular pump and can reduce the pressure of the space in the processing container 12 to a desired degree of vacuum. A loading and unloading port 12g for the wafer W is provided at the side wall of the processing container 12, and the loading and unloading port 12g can be opened and closed by a gate valve 54. For pressure control of the processing container 12, a pressure gauge or an APC (a valve that controls the opening degree of a valve body depending on a signal from the pressure gauge) may be further used.

The plasma processing apparatus 10 further includes a first high-frequency power source 62 and a second high-frequency power source 64. The first high-frequency power source 62 is a power source that generates first high-frequency electric power for plasma generation and generates high-frequency electric power at a frequency of 27 to 100 [MHz], for example, 60 [MHz]. In addition, the first high-frequency power source 62 has a pulse specification and can be controlled with a frequency of 5 to 10 [kHz] and a duty of 50% to 100%. The first high-frequency power source 62 is connected to the upper electrode 30 via a matching device 66. The matching device 66 is a circuit for matching the output impedance of the first high-frequency power source 62 with the input impedance on a load side (the lower electrode LE side). The first high-frequency power source 62 may be connected to the lower electrode LE via the matching device 66.

The second high-frequency power source 64 is a power source that generates second high-frequency electric power for drawing ions to the wafer W, that is, high-frequency bias electric power, and generates high-frequency bias electric power at a frequency in a range of 400 [kHz] to 40.68 [MHz], for example, 13.56 [MHz]. In addition, the second high-frequency power source 64 has a pulse specification and can be controlled with a frequency of 5 to 40 [kHz] and a duty of 20% to 100%. The second high-frequency power source 64 is connected to the lower electrode LE via a matching device 68. The matching device 68 is a circuit for matching the output impedance of the second high-frequency power source 64 with the input impedance on the load side (the lower electrode LE side).

The plasma processing apparatus 10 further includes a power source 70. The power source 70 is connected to the upper electrode 30. The power source 70 applies a voltage for drawing positive ions present in the processing space Sp to the electrode plate 34 to the upper electrode 30. In an example, the power source 70 is a DC power source that generates a negative DC voltage. When such a voltage is applied from the power source 70 to the upper electrode 30, positive ions present in the processing space Sp collide with the electrode plate 34. Accordingly, secondary electrons and/or an electrode material may be emitted from the electrode plate 34. Likewise, deposition containing copper adhered onto the electrode plate 34 can also be emitted.

A controller Cnt is a computer including a processor, a storage unit, an input device, a display device, and the like, and controls each unit of the plasma processing apparatus 10. Specifically, the controller Cnt is connected to the valve group 42, the flow rate controller group 44, the exhaust device 50, the first high-frequency power source 62, the matching device 66, the second high-frequency power source 64, the matching device 68, the power source 70, the heater power source HP, and the chiller unit.

The controller Cnt operates according to programs based on input recipes and transmits control signals. It is possible to control the DC power source 22 and the switch 23 connected to the electrostatic chuck ESC, the selection and flow rates of the gases supplied from the gas source group 40, the exhaust of the exhaust device 50, the supply of the electric power from the first high-frequency power source 62 and the second high-frequency power source 64, the application of the voltage from the power source 70, the supply of the electric power to the heater power source HP, and the flow rate and temperature of the refrigerant from the chiller unit, according to the control signals from the controller Cnt. Each step of the method MT (the method for etching a copper layer) disclosed in this specification can be executed by operating each part of the plasma processing apparatus 10 under the control by the controller Cnt.

Returning to FIG. 1, the method MT will be described in detail. Hereinafter, an example in which the plasma processing apparatus 10 is used for executing the method MT will be described. In the following description, parts (b) to (d) of FIG. 2 will be referred to together with part (a) of FIG. 2. Parts (b) to (d) of FIG. 2 are sectional views illustrating states of the main constituent portion of the wafer W after the execution of each step of the method MT shown in FIG. 1.

In a step ST1, the wafer W illustrated in part (a) of FIG. 2 is prepared on the placing table PD of the processing container 12. The sequence SQ subsequent to the step ST1 includes a step ST21 (first step), ST22 (second step), and ST23 (third step). The step ST21 is executed subsequently to the step ST1, the step ST22 is executed subsequently to the step ST21, and the step ST23 is executed subsequently to the step ST22. By repeatedly executing the sequence SQ, etching of the etching target layer EL containing copper can proceed with high selectivity.

The step ST21 is a step of generating a plasma of a first gas in the processing container 12 of the plasma processing apparatus 10 in which the wafer W is accommodated. In the step ST21, as illustrated in part (b) of FIG. 2, by the plasma of the first gas, a hydrocarbon film (hereinafter, referred to as an HC film 81) is formed on a side surface FC (which includes a side surface of the mask MK and after etching, also includes a side surface of a trench of the etching target layer formed by the etching, the same will be applied hereinbelow) of a groove (which is a groove defined by the mask MK and after etching, includes a trench of the etching target layer EL formed by the etching, the same will be applied hereinbelow) of a pattern defined by the mask MK, and on the principal surface SF of the etching target layer EL. Specifically, the first gas is supplied into the processing container 12 from a gas source selected from among the plurality of gas sources of the gas source group 40. The first gas may be a hydrocarbon gas. Specifically, the first gas may be, for example, $CH_4$ gas. By operating the exhaust device 50, the pressure inside the processing container 12 is set to a predetermined pressure. High-frequency electric power is supplied from the first high-frequency power source 62. High-frequency bias electric power is supplied from the second high-frequency power source 64. Accordingly, a plasma is generated. As illustrated in part (b) of FIG. 2, the HC film 81 is fainted on the side surface FC and the principal surface SF of the etching target layer EL by the generated plasma. An execution time of the step ST21 can be increased or decreased according to the aspect ratio of the groove of the pattern defined by the mask MK during the execution of the step ST21. The aspect ratio of the groove of the pattern is the ratio between the width of the groove and the height of the groove.

The step ST22 is a step of generating a plasma of a second gas in the processing container 12 of the plasma processing apparatus 10 in which the wafer W is accommodated. In the step ST22, as illustrated in part (c) of FIG. 2, by the plasma of the second gas, the HC film 81 formed on the principal surface SF is sputtered and removed, and carbon contained in the HC film 81 diffuses into the etching target layer EL from the principal surface SF such that a mixed layer 82 containing copper and carbon is formed on the principal surface SF of the etching target layer EL. A sputtering time of the step ST22 is set such that the HC film 81 on the principal surface SF is completely removed and furthermore a portion of the mixed layer 82 is removed but the mixed layer 82 is not completely removed. Specifically, the second gas is supplied into the processing container 12 from a gas source selected from among the plurality of gas sources of the gas source group 40. The second gas may contain either a rare gas or a mixed gas of a rare gas and hydrogen gas. By operating the exhaust device 50, the pressure inside the processing container 12 is set to a predetermined pressure. High-frequency electric power is supplied from the first high-frequency power source 62. High-frequency bias electric power is supplied from the second high-frequency power source 64. Accordingly, a plasma is generated. As illustrated in part (c) of FIG. 2, by the generated plasma, the HC film 81 formed on the principal surface SF is sputtered and removed, and carbon contained in the HC film 81 diffuses into the etching target layer EL from the principal surface SF such that the mixed layer 82 containing copper and carbon is formed on the principal surface SF of the etching target layer EL. Furthermore, the mixed layer 82 forms an organic copper compound by being activated by the sputtering and the volatility of sputtered by-products increases, so that etching with high verticality is possible while the mixed layer 82 is present. In a case where an execution time of the step ST22 is further extended, there may be cases where the mixed layer 82 is completely removed during the execution of the step ST22. After the HC film 81 is completely removed, copper of the etching target layer EL is removed only by physical sputtering, and a processed shape of the etching target layer EL may have a tapered shape. Therefore, sputtered copper can adhere to the side surface FC.

Specifically, the rare gas contained in the second gas may be, for example, argon gas (Ar gas). The rare gas that can be contained in the second gas may be, as well as the argon gas, helium gas, neon gas, krypton gas, xenon gas, or the like. In a case where such a rare gas is used, a sputter yield to copper contained in the etching target layer EL is sufficiently higher than a sputter yield to carbon contained in the HC film 81 and the mixed layer 82 and a sputter yield to a heavy element such as tungsten (W) contained in the mask MK. Therefore, sputtering using the rare gas can be sputtering with high selectivity for the wafer W. In this embodiment, in the following description, the rare gas of the second gas is exemplified by only the argon gas. However, in the following description of this embodiment, all the actions and effects exhibited in the case where the second gas is the argon are similarly exhibited in cases of other rare gases.

The step ST23 is a step of generating a plasma of a third gas in the processing container 12 of the plasma processing apparatus 10 in which the wafer W is accommodated. In the step ST23, as illustrated in part (d) of FIG. 2, by the plasma of the third gas, carbon is removed from the mixed layer 82 which is formed on the principal surface SF of the etching target layer EL and is exposed due to the step ST22. Furthermore, the HC film 81 formed on the side surface FC is also removed. Specifically, the third gas is supplied into the processing container 12 from a gas source selected from among the plurality of gas sources of the gas source group 40. The third gas may contain hydrogen gas. By operating the exhaust device 50, the pressure inside the processing container 12 is set to a predetermined pressure. High-frequency electric power is supplied from the first high-frequency power source 62. High-frequency bias electric power is supplied from the second high-frequency power source 64. Accordingly, a plasma is generated. As illustrated in part (d) of FIG. 2, by the generated plasma, carbon is removed from the mixed layer 82 which is formed on the principal surface SF of the etching target layer EL and is exposed due to the step ST22 such that the mixed layer 82 is removed, and furthermore, the HC film 81 formed on the side surface FC is also removed. In a case where the sequence SQ does not include the step ST23, the concentration of carbon in the mixed layer 82 remaining after the execution of the step ST22 increases every time the sequence SQ is repeated, so that excess carbon accumulates. As a result, the etching finally stops. In addition, as the hydrocarbon film deposited on the side surface FC increases in thickness, the shape of the groove of the pattern may become a tapered shape.

As described above, by executing the sequence SQ once, a portion of the etching target layer EL containing copper, which is not covered with the mask MK, can be etched with high selectivity.

In a step ST3 subsequent to the sequence SQ, it is determined whether or not the number of repetitions of the sequence SQ reaches a preset number of times. In a case where it is determined that the number of repetitions does not reach the corresponding number of times (No in the step ST3), the sequence SQ is executed gain. In a case where it is determined that the number of repetitions reaches the corresponding number of times (Yes in the step ST3), the process regarding the method MT is ended, and a subsequent predetermined process is executed. That is, in the step ST3, since the sequence SQ is repeatedly executed until the number of repetitions of the sequence SQ reaches the preset number of times, etching into a desired depth in the etching target layer EL containing copper with high selectivity is possible. The number of repetitions of the sequence SQ can be determined according to the depth of etching for the etching target layer EL.

Figure 5:
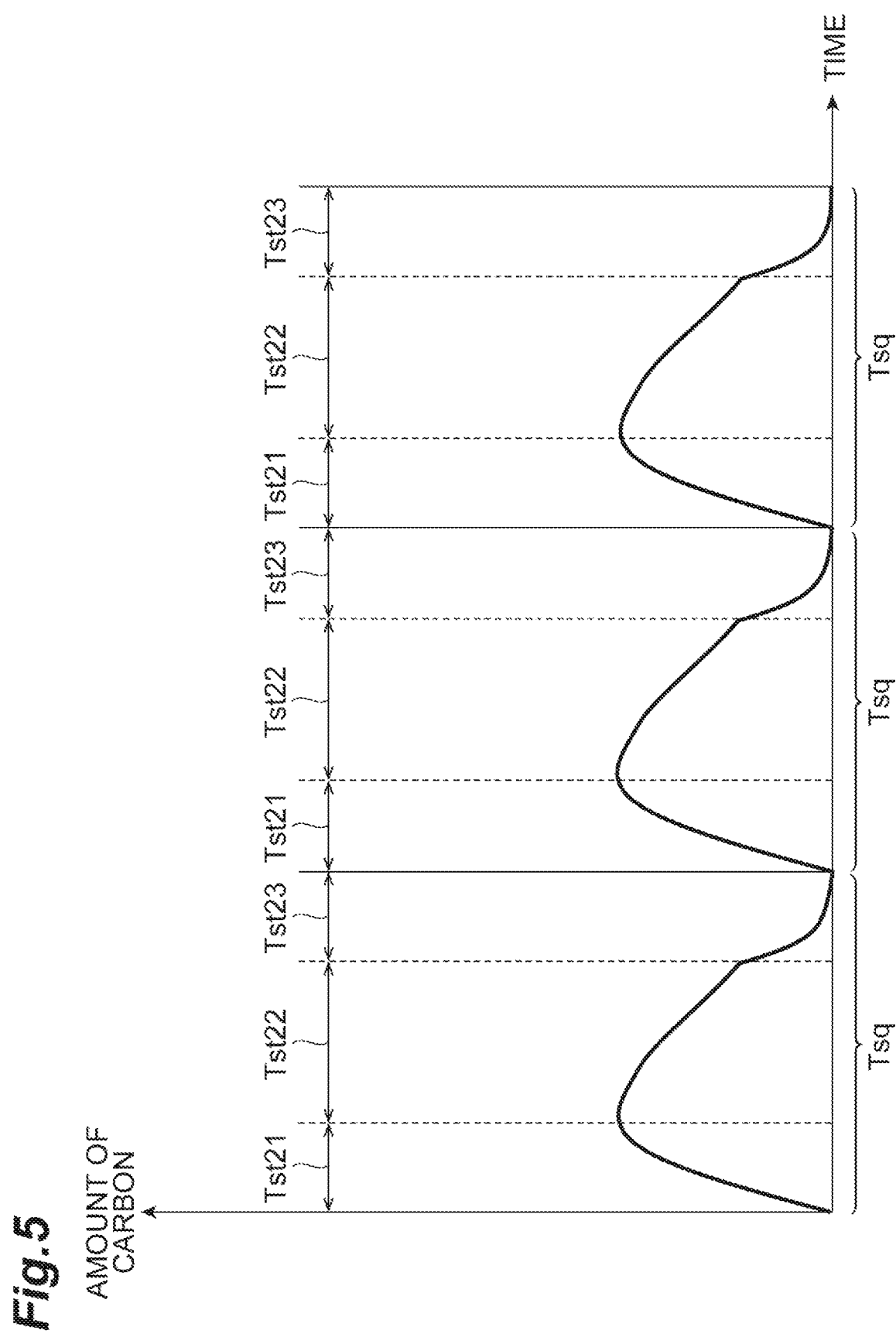
FIG. 5 is a diagram schematically showing a change in the amount of carbon on the surface of the workpiece during the execution of the sequence included in the method shown in FIG. 1.

A change in the amount of carbon contained in the HC film 81 and the mixed layer 82 formed on the principal surface SF of the etching target layer EL during the execution of the sequence SQ is shown in FIG. 5. The horizontal axis of FIG. 5 represents time, and the vertical axis of FIG. 5 represents the amount of carbon adhering to the principal surface SF of the etching target layer EL. Tsq shown in FIG. 5 represents an execution time of the sequence SQ, Tst21 shown in FIG. 5 represents the execution time of the step ST21, Tst22 shown in FIG. 5 represents the execution time of the step ST22, and Tst23 shown in FIG. 5 represents an execution time of the step ST23. In the step ST21, as the HC film 81 is formed on the principal surface SF of the etching target layer EL by the plasma of the first gas, the amount of carbon adhering to the principal surface SF of the etching target layer EL increases. In the step ST22, since the HC film 81 is sputtered by the plasma of the second gas, as the sputtering of the HC film 81 proceeds with time, the amount of carbon adhering to the principal surface SF of the etching target layer EL decreases. However, even at the time of the end of the step ST22, carbon remains on the principal surface SF of the etching target layer EL. The carbon remaining on the principal surface SF of the etching target layer EL at the time of the end of the step ST22 is carbon contained in the mixed layer 82, and the HC film 81 is entirely removed at the time of the end of the step ST22. The carbon remaining on the principal surface SF of the etching target layer EL at the time of the end of the step ST22 is entirely removed in the step ST23. That is, in the step ST23, the carbon remaining on the principal surface SF of the etching target layer EL at the time of the end of the step ST22 is removed from the mixed layer 82 by the plasma of the third gas.

The amount of copper of the etching target layer EL etched by the plasma of the second gas in the step ST22 is larger than any of the amount of copper of the etching target layer EL etched by the plasma of the first gas in the step ST21 and the amount of copper of the etching target layer EL etched by the plasma of the third gas in the step ST23.

Figure 6:
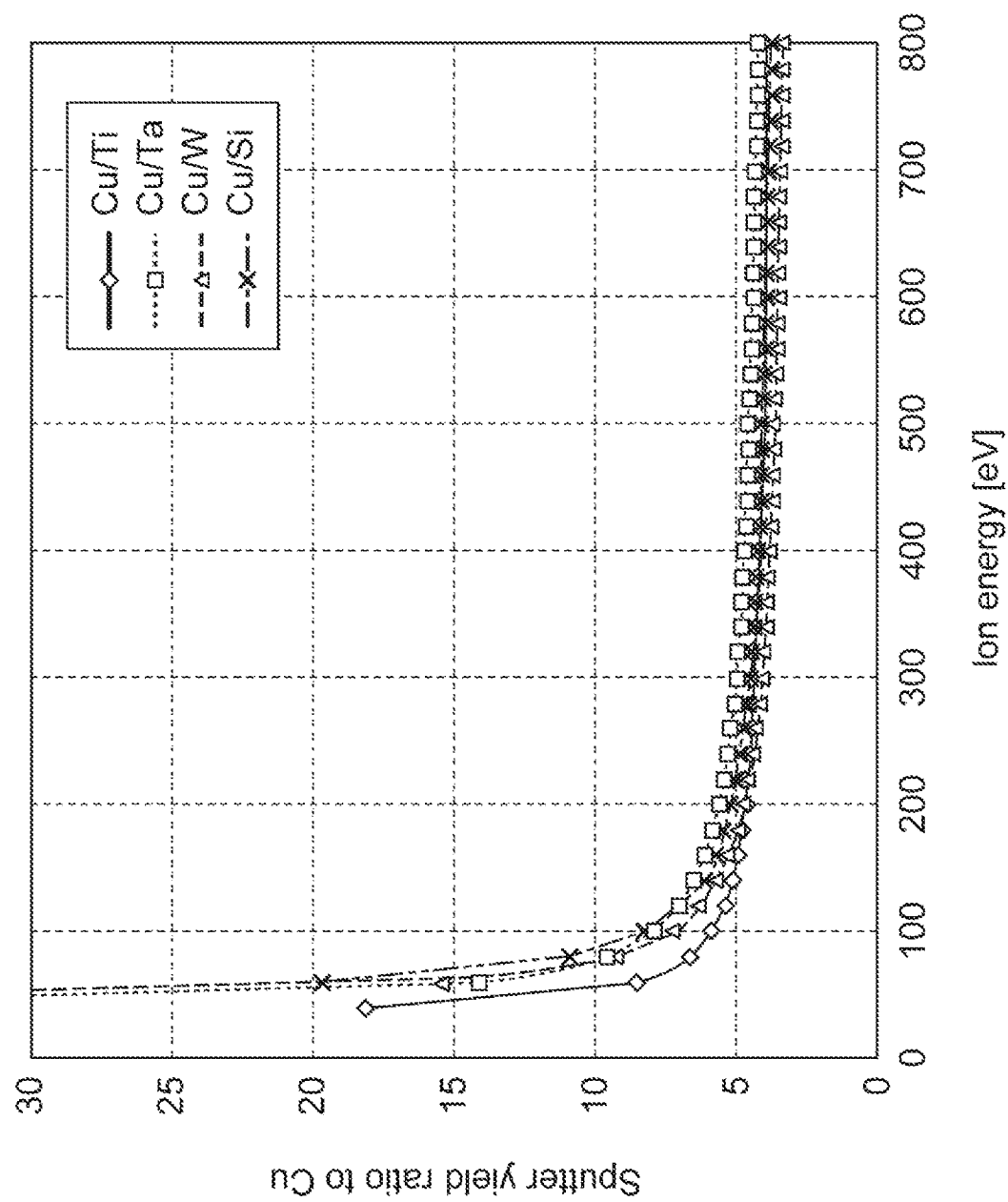
FIG. 6 is a diagram showing a simulation result used for determining process conditions of the sequence of the method MT shown in FIG. 1.
Figure 7:
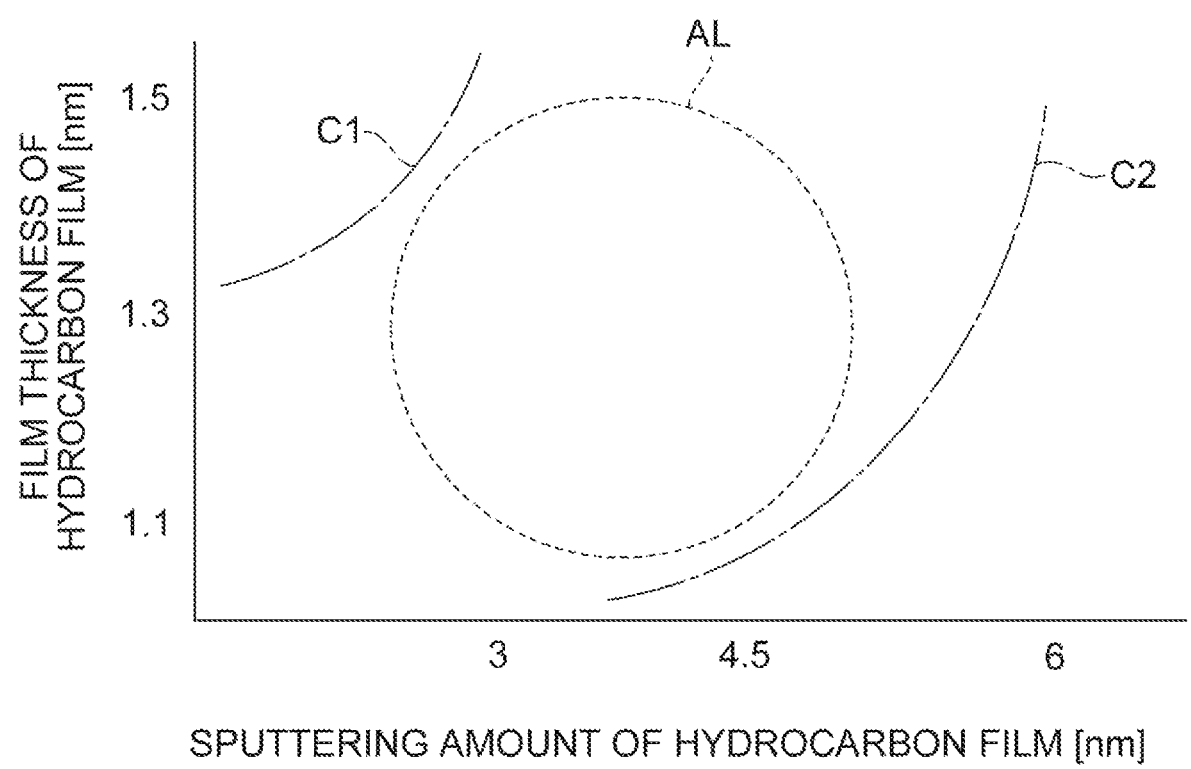
FIG. 7 is a diagram showing a measurement result used for determining the process conditions of the sequence of the method shown in FIG. 1.
Figure 9:
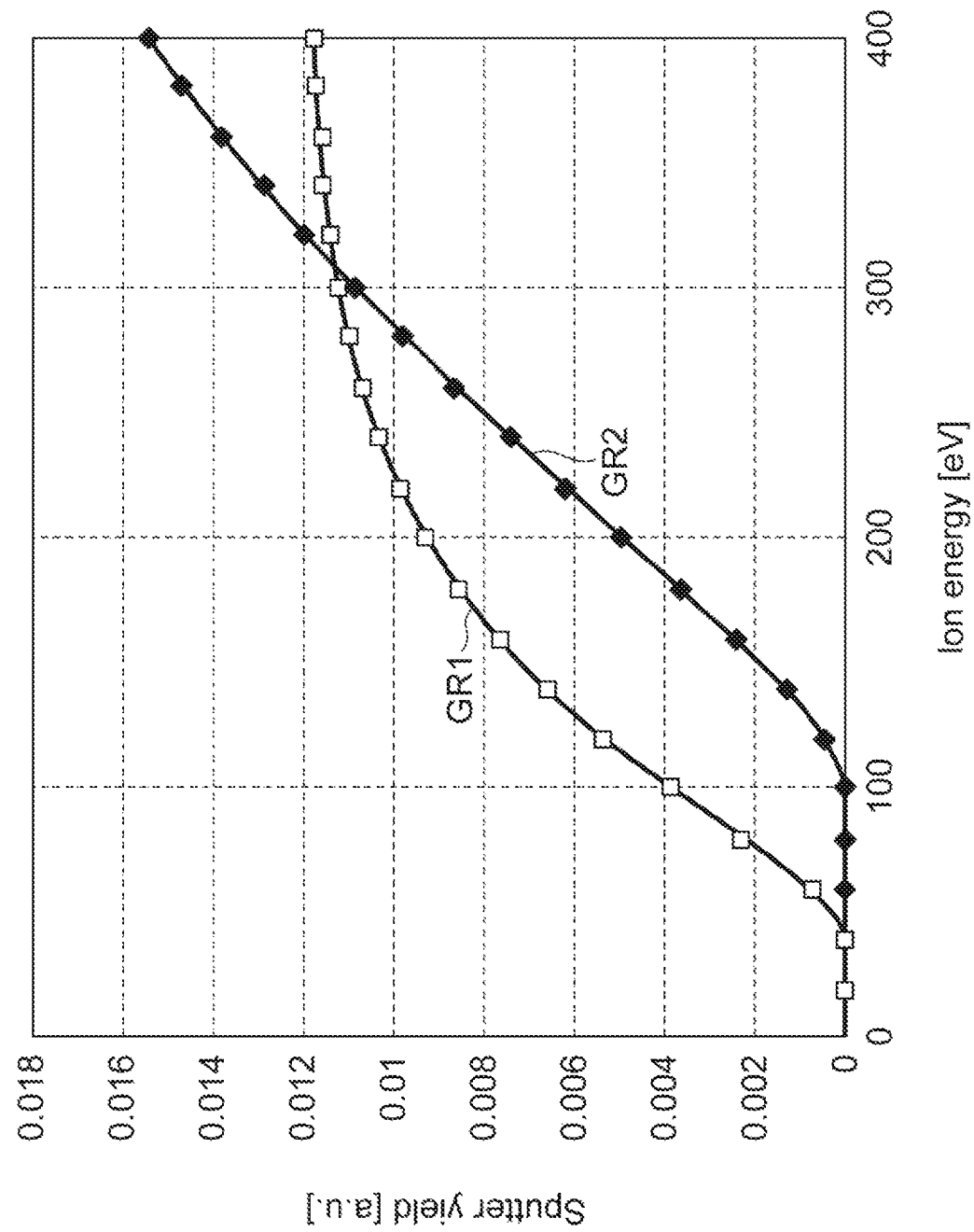
FIG. 9 is a diagram showing another simulation result used for determining the process conditions of the sequence of the method shown in FIG. 1.

Next, referring to FIGS. 6 to 9, process conditions used in the sequence SQ will be described in more detail. FIG. 6 is a diagram showing a simulation result used for determining the process conditions of the sequence of the method MT shown in FIG. 1. FIG. 9 is a diagram showing another simulation result used for determining the process conditions of the sequence of the method MT shown in FIG. 1. FIG. 7 is a diagram showing a measurement result used for determining the process conditions of the sequence of the method MT shown in FIG. 1. Parts (a) and (b) of FIG. 8 are diagrams showing tables for describing the measurement result shown in FIG. 7. Part (a) of FIG. 8 shows a taper angle [°] of the side surface FC in the etching target layer EL after etching obtained in a case where the wafer W is etched under the condition corresponding to a value on the vertical axis and a value on the horizontal axis in FIG. 7. Part (b) of FIG. 8 shows the ratio between the value on the horizontal axis and the value on the horizontal axis in FIG. 7. The taper angle [°] of part (a) of FIG. 8 indicates an angle θ [°] shown in FIG. 3. The angle θ [°] shown in FIG. 3 is an angle (acute angle) formed between the side surface FC and the principal surface SF of the etching target layer EL (or the angle θ may be an angle (acute angle) formed between the side surface FC and a surface extending along the surface of the plate-like wafer W (the principal surface FW of the wafer W and the back surface of the wafer W), and represents the inclination of the side surface FC. A reference line LN1 shown in FIG. 3 is parallel to the side surface FC, and a reference line LN2 shown in FIG. 3 is parallel to the principal surface SF of the etching target layer EL (or the reference line LN2 is parallel to the surface extending along the surface of the plate-like wafer W (the principal surface FW of the wafer W and the back surface of the wafer W).

First, referring to FIG. 6, the process conditions of the step ST22 will be described. The horizontal axis of FIG. 6 represents the energy (ion energy) [eV] of argon ions, and the vertical axis of FIG. 6 represents the value of a quotient (sputter yield ratio to Cu) obtained by dividing the sputter yield to the copper layer (Cu) by the sputter yields to various materials (Ti, Ta, W, and Si) that can be used in the mask MK. As shown in FIG. 6, it can be seen that in a case where the energy of the argon ions is equal to or less than 200 [eV], the sputter yield to the copper layer is significantly higher than those to the various material layers. That is, it can be seen that in the step ST22, in the case where the energy of the argon ions is equal to or less than 200 [eV], etching of the etching target layer EL containing copper proceeds faster than etching of the mask MK. Therefore, in a case where the energy of the argon ions is equal to or less than 200 [eV], copper sputtering performed in the step ST22 can be realized with high selectivity.

In the step ST22, the value [eV] of the energy of the argon ions is about ½ of the value [V] of a bias voltage applied to the wafer W by the second high-frequency power source 64, and it is found that the bias voltage actually applied to the wafer W in order to realize a desirable ion energy of about 200 [eV] for realizing high selectivity for the mask MK is desirably equal to or less than 400 [V]. In addition, in the step ST22, a necessary energy for obtaining a necessary argon ion energy for obtaining an effect of sputtering the copper layer is typically 50 [eV], and thus the value [V] of the bias voltage applied to the wafer W by the second high-frequency power source 64 is about 100 [V]. Therefore, the bias voltage applied to the wafer W in a case where the plasma of the second gas is generated in the step ST22 is in a range of 100 [V] to 400 [V]. In addition, the energy of the argon ions shown in FIG. 6 represents the energy of the argon ions being incident onto the wafer W.

The process conditions of the step ST22 will be further described with reference to FIG. 7 and part (a) of FIG. 8. The horizontal axis of FIG. 7 represents the sputtering amount [nm] of the hydrocarbon film, and the vertical axis of FIG. 7 represents the film thickness [nm] of the hydrocarbon film. The sputtering amount [nm] of the hydrocarbon film shown on the horizontal axis of FIG. 7 corresponds to the execution time of the step ST22 assuming that a sputtering rate of the HC film 81 in the step ST22 is constant. The hydrocarbon film having a film thickness shown on the vertical axis of FIG. 7 is a film formed on the surface of the copper layer used for measurement (a flat surface of copper formed on a wafer for measurement corresponding to the principal surface SF of the etching target layer EL), and the film thickness of the hydrocarbon film having a film thickness shown on the vertical axis of FIG. 7 is a value higher than the film thickness of the HC film 81 formed on the principal surface SF of the etching target layer EL on which the mask MK is provided, by approximately 0.3 [nm]. That is, a value obtained by subtracting 0.3 from the value [nm] of the film thickness shown on the vertical axis of FIG. 7 corresponds to the film thickness of the HC film 81 formed in the step ST21. The column direction (the sputtering amount of the hydrocarbon film) of the tables shown in parts (a) and (b) of FIG. 8 correspond to the horizontal axis of FIG. 7, and the raw direction (the film thickness of the hydrocarbon film) of the tables shown in parts (a) and (b) of FIG. 8 corresponds to the vertical axis of FIG. 7.

As can be seen from FIG. 7 and part (a) of FIG. 8, in a case where the film thickness of the HC film 81 formed on the etching target layer EL (the principal surface SF) by the plasma of the first gas in the step ST21 is in a range of 0.8 [nm] to 1.2 [nm] (in a range of 1.1 [nm] to 1.5 [nm] as the values on the vertical axis of FIG. 7) including 1.0 [nm] (1.3 [nm] as the value on the vertical axis of FIG. 7), the taper angle of the side surface FC after the sequence SQ is relatively large and close to 90[°]. Moreover, in a case where the value on the horizontal axis (the sputtering amount of the hydrocarbon film) of FIG. 7 is in a range of 2.0 times to 3.5 times (in a range of 2.2 [nm] to 5.3 [nm] as the values on the horizontal axis of FIG. 7) the 1.1 [nm] to 1.5 [nm] on the vertical axis of FIG. 7, the taper angle of the side surface FC after the sequence SQ is relatively large and close to 90[°]. That is, in a case where the execution time (the sputtering time) of the step ST22 is in a range (in FIG. 7, a region interposed between a curve C1 and a curve C2 of FIG. 7, and more specifically, a region including, for example, an area AL) of 2.0 times to 3.5 times a time necessary for etching and removing the HC film 81 having a film thickness in a range of 0.8 [nm] to 1.2 [nm] (in a range of 1.1 [nm] to 1.5 [nm] as the values on the vertical axis of FIG. 7) under the process conditions of the step ST22 excluding the condition of the execution time, the taper angle of the side surface FC after the sequence SQ is relatively large and close to 90[°]. The execution time (sputtering time) of the step ST22 in such a range can be further increased or decreased according to a change in the aspect ratio of the groove of the pattern which becomes an etching object as etching proceeds.

It can be seen that the distribution of the taper angles of part (a) of FIG. 8 and the distribution of the ratios ((the sputtering amount of the hydrocarbon film)/(the film thickness of the hydrocarbon film)) of part (b) of FIG. 8 are in inverse proportion to each other. That is, as the value of (the sputtering amount of the hydrocarbon film)/(the film thickness of the hydrocarbon film) decreases, that is, the sputtering amount of the hydrocarbon film is relatively small, the taper angle of the side surface FC after etching is large and becomes close to 90 [°], thereby realizing high selectivity.

Referring to FIG. 9, the process conditions of the step ST23 will be described. The horizontal axis of FIG. 9 represents the energy (ion energy) [eV] of hydrogen ions, and the vertical axis of FIG. 9 represents the sputter yield [a.u.] (any unit). A simulation result GR1 shown in FIG. 9 represents the sputter yield to a carbon layer, and a simulation result GR2 shown in FIG. 9 represents the sputter yield to the copper layer. As shown in FIG. 9, it can be seen that in a case where the energy of hydrogen ions is higher than 50 [eV] and lower than 300 [eV], the sputter yield to the carbon layer is higher than the sputter yield to the copper layer. That is, in the step ST23, in the case where the energy of hydrogen ions is higher than 50 [eV] and lower than 300 [eV], the mixed layer 82 containing carbon is sufficiently sputtered, and even after the mixed layer 82 is sufficiently removed, etching of the etching target layer EL containing copper can be suppressed. Therefore, in the case where the energy of hydrogen ions is in a range of higher than 50 [V] and lower than 300 [V], in the step ST23, removal of carbon from the HC film 81 and the mixed layer 82 containing carbon can be selectively performed compared to copper. In the step ST23, since the value [eV] of the energy of hydrogen ions is about ½ of the value [V] of the bias voltage applied to the wafer W by the second high-frequency power source 64, the bias voltage applied to the wafer W in the case of generating the plasma of the third gas in the step ST23 is in a range of higher than 100 [V] and lower than 600 [V]. The energy of hydrogen ions shown in FIG. 9 represents the energy of hydrogen ions being incident onto the wafer W.

In the method MT, there may be cases where copper, organic substances, and the like generated (scattered) by the etching executed in the sequence SQ (particularly in the step ST22) adhere to the inside of the processing container 12 and are deposited. When copper, organic substances, and the like are deposited on the upper electrode 30, the conductivity of the surface of the electrode plate 34 of the upper electrode 30 is changed, and the reproducibility of the process also decreases. The organic substances can be easily removed by a plasma of oxygen, hydrogen, or the like. However, it is difficult to remove copper, and for example, when the electrode plate 34 made of Si is used, copper diffuses into Si such that it becomes more difficult to remove copper. In this situation, in a case where the electrode plate 34 of the upper electrode 30 contains silicon carbide or copper, a change in the conductivity due to the diffusion of copper atoms in the electrode plate 34 in the case where copper is deposited on the electrode plate 34 is small. Furthermore, as shown in FIG. 1, the method MT may further include a step ST4 (fourth step) of applying a DC voltage, or applying a high-frequency voltage at about 60 [MHz] between the upper electrode 30 and the lower electrode LE using the electrode plate 34 containing silicon carbide or copper. The step ST4 is a step of performing a treatment on the electrode described above (particularly the upper electrode 30), and as shown in FIG. 1, is executed after the sequence is repeatedly executed so that an etching of the copper layer is ended and the wafer W is unloaded.

Hereinafter, examples of the process conditions of each of the step ST21, the step ST22, and the step ST23 will be described.

<Step ST21>
Value [mTorr] of the pressure in the processing container 12: 10 [mTorr]
Value [W] of high-frequency electric power of the first high-frequency power source 62: 300 [W]
Value [W] of high-frequency electric power of the second high-frequency power source 64: 0 [W] (high-frequency voltage 0 [V])
Processing gas: $CH_4$ gas
Flow rate [sccm] of the processing gas: 100 [sccm]
Processing time [s]: 3 [s]
<Step ST22>
Value [mTorr] of the pressure in the processing container 12: 5 [mTorr]
Value [W] of high-frequency electric power of the first high-frequency power source 62: 300 [W]
Value [W] of high-frequency electric power of the second high-frequency power source 64: 50 [W] (high-frequency voltage 200 [V])
Processing gas: Ar gas
Flow rate [sccm] of the processing gas: 100 [sccm]
Processing time [s]: 10 [s]
<Step ST23>
Value [mTorr] of the pressure in the processing container 12: 10 [mTorr]
Value [W] of high-frequency electric power of the first high-frequency power source 62: 300 [W]
Value [W] of high-frequency electric power of the second high-frequency power source 64: 100 [W] (high-frequency voltage 600 [V])
Processing gas: $H_2$ gas and $N_2$ gas
Flow rate [sccm] of the processing gas: ($H_2$) 150 [sccm], ($N_2$) 150 [sccm]
Processing time [s]: 5 [s]
<Sequence SQ (Steps ST21 to ST23)>
Temperature [° C.] of the electrostatic chuck ESC: 120 [° C.]
Temperature [° C.] of the processing container: 80 [° C.]
Number of repetitions [times]: 80 [times]

According to the method MT according to the embodiment, whenever the sequence SQ is executed, in the step ST21, the HC film 81 containing carbon is formed on the etching target layer EL containing copper, in the step ST22 subsequent to the step ST21, the HC film 81 containing carbon is sputtered and is thus removed, carbon contained in the HC film 81 diffuses into the etching target layer EL, and the mixed layer 82 of copper and carbon is formed on the principal surface SF of the etching target layer EL and is simultaneously removed, and in the step ST23 subsequent to the step ST22, excess carbon is removed from the mixed layer 82 and the side surface FC (which includes the side surface of the mask MK and after etching, includes the side surface of the trench of the etching target layer EL formed by the etching) of the groove (which is the groove defined by the mask MK and after etching, includes the trench of the etching target layer EL formed by the etching) of the pattern defined by the mask MK. Accordingly, in the case where the sequence SQ is repeatedly executed, etching of copper of the etching target layer EL can be performed without stopping etching due to excess carbon. In addition, since the amount of excess carbon of the side surface FC of the groove of the pattern decreases, the verticality of the side surface FC of the groove of the pattern is improved.

According to the method MT according to the embodiment, removal of the etching target layer EL containing copper, which is mainly performed in the step ST22, leads to chemically assisted etching of the etching target layer EL, and thus leads to prevention of the processed shape of the etching target layer EL from becoming a tapered shape due to removal of the etching target layer EL which is mainly performed by physical sputtering.

According to the method MT according to the embodiment, since the film thickness of the HC film 81 formed on the mask MK and the etching target layer EL by the plasma of the first gas in the step ST21 is 0.8 [nm] or more and 1.2 [nm] or less, etching by sputtering performed in the step ST22 is realized with high selectivity, so that the verticality of the side surface of the groove of the pattern defined by the mask MK is improved. Therefore, the verticality during processing of the copper layer can be improved.

According to the method MT according to the embodiment, the execution time of the step ST21 can be increased or decreased according to the aspect ratio of the groove of the pattern which increases with the progress of etching. Therefore, since the execution time of the step ST21 can be increased or decreased according to the aspect ratio, a uniform film can be formed on the principal surface SF of the etching target layer EL and the surface of the mask MK by the plasma of the first gas regardless of the change in the aspect ratio of the groove of the pattern defined by the mask MK during the execution of the step ST21.

According to the method MT according to the embodiment, the execution time of the step ST22 is increased or decreased according to the aspect ratio of the groove of the pattern which increases with the progress of etching. Therefore, the execution time of the step ST22 can be increased or decreased according to the change in the aspect ratio of the groove of the pattern defined by the mask during the execution of the step ST22 with the progress of the etching. Therefore, regardless of the aspect ratio of the groove of the pattern defined by the mask during the execution of the second step, etching of the HC film 81 that is formed in the step ST21 and contains carbon and furthermore, etching of the mixed layer 82 that is formed in the step ST22 and contains copper and carbon can be more suitably performed by the plasma of the second gas within the execution time of the step ST22.

According to the method MT according to the embodiment, in the step ST22, since the bias voltage applied to the wafer W in the case where the plasma of the second gas is generated is in a range of 100 [V] to 400 [V], a sufficient ion energy to penetrate the HC film 81 deposited in the step ST21 is obtained, the mixed layer 82 of the HC film 81 containing hydrocarbon and the etching target layer EL is formed, and furthermore, it becomes possible to remove the mixed layer 82 by sputtering. The energy of ions accelerated by the bias voltage in this case corresponds to a range of 200 [eV] or less. Furthermore, since etching of the etching target layer EL containing copper proceeds faster than etching of the mask MK, sputtering performed in the step ST22 is realized with high selectivity, and the verticality of the side surface of the groove of the pattern defined by the mask MK is improved. As described above, the volatility of sputtered by-products increases due to the effect of mixing the organic layer and the copper layer, so that the verticality of the processing of the copper layer can be improved.

According to the method MT according to the embodiment, the execution time of the step ST22 is 2.0 times or more to 3.5 times or less the time necessary for etching the HC film 81 deposited in the step ST21 and removing the HC film 81. Therefore, the execution time of the step ST22 is 2.0 times or more and 3.5 times or less the time necessary for etching a film and removing the film under the process conditions of the step ST22 excluding the condition of the execution time. Therefore, the HC film 81 deposited in the step ST21 and the etching target layer EL are mixed by the ion energy in the step ST22 and it is possible to perform chemically assisted etching on the etching target layer EL containing copper. Furthermore, the process can proceed to the step ST23, which is executed after the step ST22, before the HC film 81 is completely removed and etching proceeds to pure sputtering of copper of the etching target layer EL. As described above, since the step ST22 is stopped before the mixed layer 82 is completely removed in the step ST22, the verticality of the processing of the copper layer is increased, excess carbon is removed by the step ST23, which is executed after the step ST22, and thus deposition of carbon due to the progress of etching is suppressed. Therefore, etching of the etching target layer EL containing copper is reliably performed.

According to the method MT according to the embodiment, in the step ST23, since the bias voltage applied to the wafer W in the case where the plasma of the third gas is generated is in a range of higher than 100 [V] and lower than 600 [V], the sputter yield to the etching target layer EL in the step ST23 is smaller than the sputter yield to the etching target layer EL in the step ST22. Furthermore, according to the method MT, in the step ST23, since the bias voltage applied to the wafer W in the case where the plasma of the third gas is generated is in a range of higher than 100 [V] and lower than 600 [V], the sputter yield to a layer containing carbon in the step ST23 is larger than the sputter yield to the copper layer. Therefore, in the step ST23, removal of carbon from the HC film 81 that is formed by the plasma of the first gas in the step ST21 and contains carbon and from the mixed layer 82 that is formed by the plasma of the second gas in the step ST22 and contains carbon and copper can be selectively performed. This is because the sputtering rate of hydrogen with respect to copper is low and carbon is efficiently removed by the formation of a hydrocarbon film. The energy of ions accelerated by the bias voltage in this case corresponds to a range of higher than 50 [eV] and lower than 300 [eV].

According to the method MT according to the embodiment, since the first gas contains $CH_4$ gas, the HC film 81 containing carbon can be formed on the mask MK and the etching target layer EL in the step ST21.

According to the method MT according to the embodiment, since the electrode plate 34 of the upper electrode 30 contains silicon carbide or copper, in a case where copper is deposited on the electrode plate 34 of the upper electrode 30 by etching performed in the sequence SQ, the change in the conductivity of the electrode plate 34 due to the diffusion of copper atoms into the electrode plate 34 can be reduced. Accordingly, the reproducibility of the etching process can be improved.

According to the method MT according to the embodiment, a step ST4 is further included for cleaning the plasma processing apparatus 10. In the step ST4, a negative static voltage is applied, or a high-frequency voltage is applied to the upper electrode 30 in the presence of the plasma. The step ST4 is executed after the sequence SQ is repeatedly executed, the etching of the etching target layer EL is ended, and the wafer W is unloaded from the plasma processing apparatus 10. That is, ions are drawn from the plasma to the upper electrode 30 of the plasma processing apparatus 10 such that deposition containing copper adhered to the upper electrode 30 can be sputtered and removed.

While the principles of the present invention have been illustrated and described in the preferred embodiment, it is understood by those skilled in the art that the present invention can be modified in arrangement and details without departing from the principles. The present invention is not limited to the specific configuration disclosed in this embodiment. Therefore, all modifications and changes coming from the scope of the claims and the spirit thereof are claimed.

Figure 10:
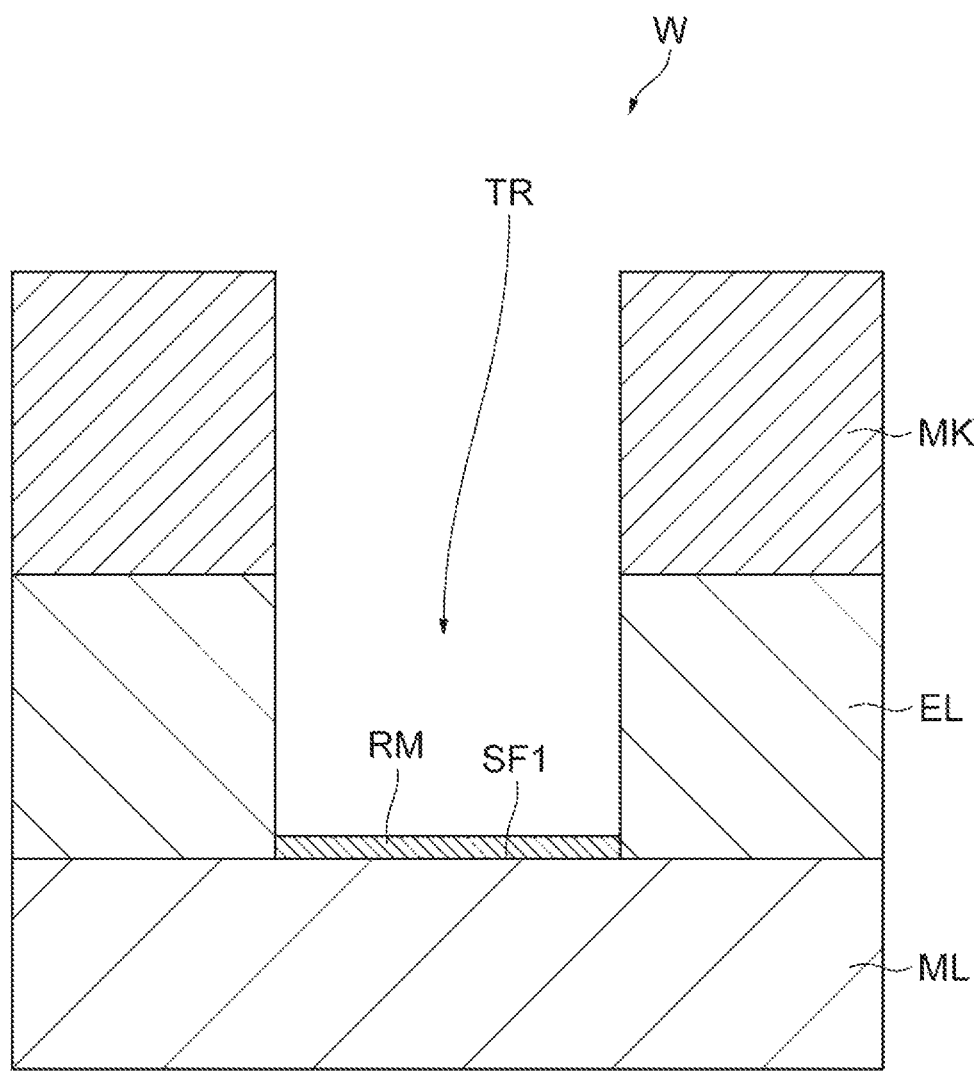
FIG. 10 is a sectional view illustrating a state of the main constituent portion of the workpiece which is etched until the copper layer reaches the underlayer, according to the method shown in FIG. 1.

For example, after the sequence SQ is executed a plurality of times and the etching target layer EL is etched until the sixth layer (the underlayer ML illustrated in FIG. 10) is reached, a step ST5 (fifth step) shown in FIG. 1 can be added to the method MT. The step ST5 can be applied in a case where the material of the sixth layer is Ta, but can also be similarly applied to a case where the sixth layer is TaN or Ru. When the sequence SQ is executed the plurality of times and the etching target layer EL is etched until the underlayer ML is reached (after YES in the step ST3, and furthermore, after the step ST4), as illustrated in FIG. 10, the underlayer ML can be exposed via a groove TR (the groove of the pattern defined by the mask MK) formed in the etching target layer EL by the etching. However, there may be cases where copper (Cu), which is the material of the etching target layer EL, remains on a surface SF1 of the underlayer ML in the groove TR. A residual layer RM illustrated in FIG. 10 is a residue of Cu generated by etching of the etching target layer EL.

For the etching of the underlayer ML, a plasma of a fluorocarbon-based gas can be used in a case where the material of the underlayer ML is Ta. However, as described above, in the case where the residual layer RM of Cu is deposited on the surface SF1 of the underlayer ML of Ta in the groove TR of the etching target layer EL, etching of the underlayer ML may be impeded by the residual layer RM of Cu remaining on the surface SF1 of the underlayer ML, and there may be case where it is difficult to perform the etching. In order to avoid such difficulties associated with the etching of the underlayer ML, as shown in FIG. 1, the method MT according to the embodiment may further include the step ST5 of removing the residual layer RM of Cu remaining on the surface SF1 of the underlayer ML in the groove TR by wet cleaning. The step ST5 is a step of removing copper of the etching target layer EL remaining on the underlayer ML after the etching target layer EL is etched until the underlayer ML is reached by repeatedly executing the sequence SQ and before the underlayer ML is etched. In the step ST5, copper remaining on the underlayer ML is removed by wet cleaning using an acidic solution such as hydrofluoric acid or citric acid. Specifically, in the wet cleaning of the step ST5, for example, about 0.5 wt % (weight percent) of dilute hydrofluoric acid (DHF) or about 8 wt % of citric acid can be used. An execution time [min] of the step ST5 can be, for example, about 2.5 [min] when about 0.5 wt % of dilute hydrofluoric acid (DHF) is used. Since Cu of the residual layer RM is eluted as ions by the action of acid by the acidic solution such as dilute hydrofluoric acid or citric acid, the residual layer RM of Cu can be favorably removed from the surface SF1 of the underlayer ML.

As described above, even in the case where Cu remains in the underlayer ML after the etching target layer EL is etched until the underlayer ML is reached, since Cu is removed before performing etching on the underlayer ML in the step ST5, it is possible to prevent etching of the underlayer ML from being impeded by Cu. In particular, in a case where the underlayer ML is Ta, TaN, or Ru, in the step ST5, it is possible to remove Cu remaining on the underlayer ML by using wet cleaning using hydrofluoric acid or citric acid.

In a case where dry etching is used instead of the wet cleaning for removal of the residual layer RM of Cu, Cu of the residual layer RM is driven into the underlayer ML of Ta, TaN, or Ru in contact with the residual layer RM by a sputtering action incurred during execution of the dry etching, so that an intermetallic compound of Cu and Ta, TaN, or Ru is formed on the underlayer ML in the groove TR. In a state in which the intermetallic compound of Cu and Ta, TaN, or Ru is formed on the surface SF1 of the underlayer ML in the groove TR, in a case where a plasma of a fluorocarbon-based gas is supplied into the groove TR in order to etch the underlayer ML of Ta, TaN, or Ru, fluoride of Cu is formed on the surface SF1 of the underlayer ML in the groove TR. However, since the vapor pressure of the fluoride of Cu is relatively low, it becomes difficult to scatter Cu by vaporizing the fluoride of Cu. Therefore, both removal of the residual layer RM of Cu, and etching of the underlayer ML become difficult. Accordingly, for removal of the residual layer RM of Cu, instead of the dry etching, wet cleaning using an acidic solution such as hydrofluoric acid or citric acid is suitable as in the step ST5.

Here, a specific example of the process conditions used for etching the underlayer ML will be described below. The gas source group 40 may further include a gas source of the following fluorocarbon-based gases ($CF_4$ gas and $C_4F_8$ gas) used for etching of the underlayer ML.

Value [mTorr] of the pressure in the processing container 12: 50 [mTorr]
Value [W] of high-frequency electric power of the first high-frequency power source 62: 500 [W]
Value [W] of high-frequency electric power of the second high-frequency power source 64: 100 [W]
Processing gas: $CF_4$ gas and $C_4F_8$ gas
Flow rate [sccm] of the processing gas: 135 [sccm] ($CF_4$ gas), 30 [sccm] ($C_4F_8$ gas)
Processing time [s]: 80 [s]

REFERENCE SIGNS LIST

10 . . . plasma processing apparatus; 12 . . . processing container; 12e . . . exhaust port; 12g . . . loading and unloading port; 14 . . . support portion; 18a . . . first plate; 18b . . . second plate; 22 . . . DC power source; 23 . . . switch; 24 . . . refrigerant flow path; 26a . . . pipe; 26b . . . pipe; 28 . . . gas supply line; 30 . . . upper electrode; 32 . . . insulating shielding member; 34 . . . electrode plate; 34a . . . gas discharge hole; 36 . . . electrode support body; 36a . . . gas diffusion chamber; 36b . . . gas flow hole; 36c . . . gas introduction port; 38 . . . gas supply pipe; 40 . . . gas source group; 42 . . . valve group; 44 . . . flow rate controller group; 46 . . . deposition shield; 48 . . . exhaust plate; 50 . . . exhaust device; 52 . . . exhaust pipe; 54 . . . gate valve; 62 . . . first high-frequency power source; 64 . . . second high-frequency power source; 66 . . . matching device; 68 . . . matching device; 70 . . . power source; 81 . . . HC film; 82 . . . mixed layer; AL . . . area; C1 . . . curve; C2 . . . curve; Cnt . . . controller; EL . . . etching target layer; ESC . . . electrostatic chuck; FC . . . side surface; FR . . . focus ring; FW . . . principal surface; GR1 . . . simulation result; GR2 . . . simulation result; HP . . . heater power source; HT . . . heater; LE . . . lower electrode; LN1 . . . reference line; LN2 . . . reference line; MK . . . mask; SF . . . principal surface; PD . . . placing table; Sp . . . processing space; W . . . wafer; MT . . . method; TR . . . groove; ML . . . underlayer; RM . . . residual layer.

The invention claimed is:
1. A method for etching a copper layer of a workpiece, the workpiece including the copper layer and a mask provided on the copper layer, the method comprising:
etching the copper layer by repeatedly executing a sequence including a first step of generating a plasma of a first gas in a processing container of a plasma processing apparatus in which the workpiece is accommodated, a second step of generating a plasma of a second gas in the processing container after the first step, and a third step of generating a plasma of a third gas in the processing container after the second step, wherein the first gas contains a hydrocarbon gas, the second gas contains either a rare gas or a mixed gas of a rare gas and hydrogen gas, the third gas contains hydrogen gas, and an amount of copper of the copper layer etched by the plasma of the second gas in the second step is larger than an amount of copper of the copper layer etched by the plasma of the first gas in the first step, and is larger than an amount of copper of the copper layer etched by the plasma of the third gas in the third step.

2. The method according to claim 1, wherein, in the third step, a bias voltage applied to the workpiece in a case of generating the plasma of the third gas is in a range of higher than 100 V and lower than 600 V.

3. The method according to claim 1, wherein the first gas contains $CH_4$ gas.

4. The method according to claim 1, wherein an electrode plate of an upper electrode of the plasma processing apparatus contains silicon carbide or copper, and the upper electrode is provided above a placing table which supports the workpiece in the processing container.

5. The method according to claim 1, further comprising:

a fourth step of applying a DC voltage or applying a high-frequency voltage between an upper electrode and a lower electrode of the plasma processing apparatus, wherein the upper electrode is provided above a placing table which supports the workpiece in the processing container, the lower electrode is provided in the placing table, and the fourth step is executed after the sequence is repeatedly executed so that an etching of the copper layer is ended and the workpiece is unloaded.

6. The method according to claim 1, wherein the workpiece further includes an underlayer, the copper layer is provided on the underlayer, and the method further comprises a fifth step of removing copper of the copper layer remaining on the underlayer after the copper layer is etched until the underlayer is reached by repeatedly executing the sequence and before the underlayer is etched.

7. The method according to claim 6, wherein a material of the underlayer is Ta, TaN, or Ru, and in the fifth step, copper remaining on the underlayer is removed by wet cleaning using hydrofluoric acid or citric acid.

8. A method for etching a copper layer of a workpiece, the workpiece including the copper layer and a mask provided on the copper layer, the method comprising:

etching the copper layer by repeatedly executing a sequence including a first step of generating a plasma of a first gas in a processing container of a plasma processing apparatus in which the workpiece is accommodated, a second step of generating a plasma of a second gas in the processing container after the first step, and a third step of generating a plasma of a third gas in the processing container after the second step, wherein the first gas contains a hydrocarbon gas, the second gas contains either a rare gas or a mixed gas of a rare gas and hydrogen gas, the third gas contains hydrogen gas, and a film thickness of a film formed on the mask and the copper layer by the plasma of the first gas in the first step is 0.8 nm or more and 1.2 nm or less.

9. The method according to claim 8, wherein an execution time of the first step is increased or decreased according to an aspect ratio of a groove of a pattern defined by the mask during execution of the first step.

10. The method according to claim 8, wherein an execution time of the second step is increased or decreased according to an aspect ratio of a groove of a pattern defined by the mask during execution of the second step.

11. The method according to claim 8, wherein, in the second step, a bias voltage applied to the workpiece in a case of generating the plasma of the second gas is in a range of 100 V to 400 V.

12. The method according to claim 11, wherein an execution time of the second step is 2.0 times or more and 3.5 times or less a time necessary for etching the film and removing the film under a process condition of the second step.

13. The method according to claim 8, wherein the film contains hydrogen and carbon.

14. The method according to claim 13, wherein carbon contained in the film diffuses into the copper layer by the plasma of the second gas, and a mixed layer containing copper and carbon is formed on the copper layer.

15. The method according to claim 14, wherein the mixed layer activated by sputtering forms an organic copper compound which is volatilized, and etching to the mixed layer is performed.

16. The method according to claim 15, wherein carbon is removed from the mixed layer by the plasma of the third gas.

* * * * *